United States Patent
Hsu et al.

(10) Patent No.: US 11,715,423 B2
(45) Date of Patent: Aug. 1, 2023

(54) DISPLAY DEVICE INCLUDING A STRETCHABLE DRIVING CIRCUIT

(71) Applicants: Interface Technology (ChengDu) Co., Ltd., Chengdu (CN); INTERFACE OPTOELECTRONICS (SHENZHEN) CO., LTD., Shenzhen (CN); INTERFACE OPTOELECTRONICS (WUXI) CO., LTD., Wuxi (CN); GENERAL INTERFACE SOLUTION LIMITED, Zhunan (TW)

(72) Inventors: Ya-Chu Hsu, Chengdu (CN); Po-Ching Lin, Chengdu (CN); Po-Lun Chen, Chengdu (CN); Chun-Ta Chen, Chengdu (CN)

(73) Assignees: Interface Technology (ChengDu) Co., Ltd., Chengdu (CN); INTERFACE OPTOELECTRONICS (SHENZHEN) CO., LTD., Shenzhen (CN); INTERSACE OPTOELECTRONICS (WUXI) CO., LTD., Wuxi (CN); GENERAL INTERFACE SOLUTION LIMITED, Zhunan (TW)

( * ) Notice: Subject to any disclaimer, the term of this patent is extended or adjusted under 35 U.S.C. 154(b) by 0 days.

(21) Appl. No.: 17/547,476

(22) Filed: Dec. 10, 2021

(65) Prior Publication Data
US 2023/0119024 A1  Apr. 20, 2023

(30) Foreign Application Priority Data
Oct. 15, 2021  (CN) .......................... 202111202571.X

(51) Int. Cl.
*G09G 3/3258*  (2016.01)

(52) U.S. Cl.
CPC .................................. *G09G 3/3258* (2013.01)

(58) Field of Classification Search
None
See application file for complete search history.

(56) References Cited

U.S. PATENT DOCUMENTS

| | | | |
|---|---|---|---|
| 2004/0192082 A1* | 9/2004 | Wagner | H05K 1/0283 439/67 |
| 2012/0051005 A1* | 3/2012 | Vanfleteren | H01L 24/81 29/854 |

(Continued)

OTHER PUBLICATIONS

Definition of package, Aug. 1, 2022, https://www.yourdictionary.com/package, p. 1 (Year: 2022).*

(Continued)

*Primary Examiner* — Kirk W Hermann
(74) *Attorney, Agent, or Firm* — ScienBiziP, P.C.

(57) ABSTRACT

A plurality of package units is on a surface of a substrate, and a driving circuit is on the surface of the substrate. Each package unit includes at least one pixel, and each pixel is provided with a plurality of light-emitting elements. The driving circuit electrically connects to the light-emitting elements and is configured to transmit a plurality of gate driving signals and a plurality of data signals to drive the plurality of light-emitting elements to emit light to display images. The driving circuit is partially in the package units and is partially between adjacent package units. The substrate and a portion of the driving circuit between adjacent package units are made to be stretchable, while the package units are not stretchable.

11 Claims, 8 Drawing Sheets

(56) References Cited

U.S. PATENT DOCUMENTS

| | | | | |
|---|---|---|---|---|
| 2016/0211471 | A1* | 7/2016 | Kwon | H01L 51/0097 |
| 2017/0181277 | A1* | 6/2017 | Tomita | H05K 1/0283 |
| 2018/0175131 | A1* | 6/2018 | Lee | H01L 27/3276 |
| 2019/0013275 | A1* | 1/2019 | Sunshine | H01L 23/5386 |
| 2020/0035778 | A1* | 1/2020 | Kim | H10K 59/1275 |
| 2020/0111390 | A1* | 4/2020 | Kim | G09F 9/301 |
| 2020/0211437 | A1* | 7/2020 | Ahn | H01L 27/3276 |
| 2021/0134191 | A1* | 5/2021 | Jung | H01L 25/167 |
| 2021/0343811 | A1* | 11/2021 | Kim | H01L 27/3258 |
| 2022/0087008 | A1* | 3/2022 | Sano | G06F 3/044 |

OTHER PUBLICATIONS

Modulus of Elasticity—Youngs Modulus for some common Materials https://www.bestech.com.au/wp-content/uploads/Modulus-of-Elasticity.pdf, p. 1 (Year: 2022).*

* cited by examiner

DISPLAY DEVICE INCLUDING A STRETCHABLE DRIVING CIRCUIT

This application claims the benefit of priority of Chinese Application No. 202111202571.X filed on Oct. 15, 2021, the contents of which are incorporated by reference herein.

FIELD

The subject matter herein generally relates to displays, and particularly relates to a display device.

BACKGROUND

A flexible display can be easily deformed when pulled, this does have a certain destructive effect on the materials including conductive components in the flexible display, and can lead to a failure of the flexible display. The conductive materials or conductive components having high tensile strength and durability reduces a risk of failure, but such conductive materials or conductive components with those characteristics have a high resistance, which, particularly on a small scale, can result in loss of electricity and/or electrical signals.

BRIEF DESCRIPTION OF THE DRAWINGS

Implementations of the present disclosure will now be described, by way of embodiment, with reference to the attached figures.

DETAILED DESCRIPTION

Figure 1:
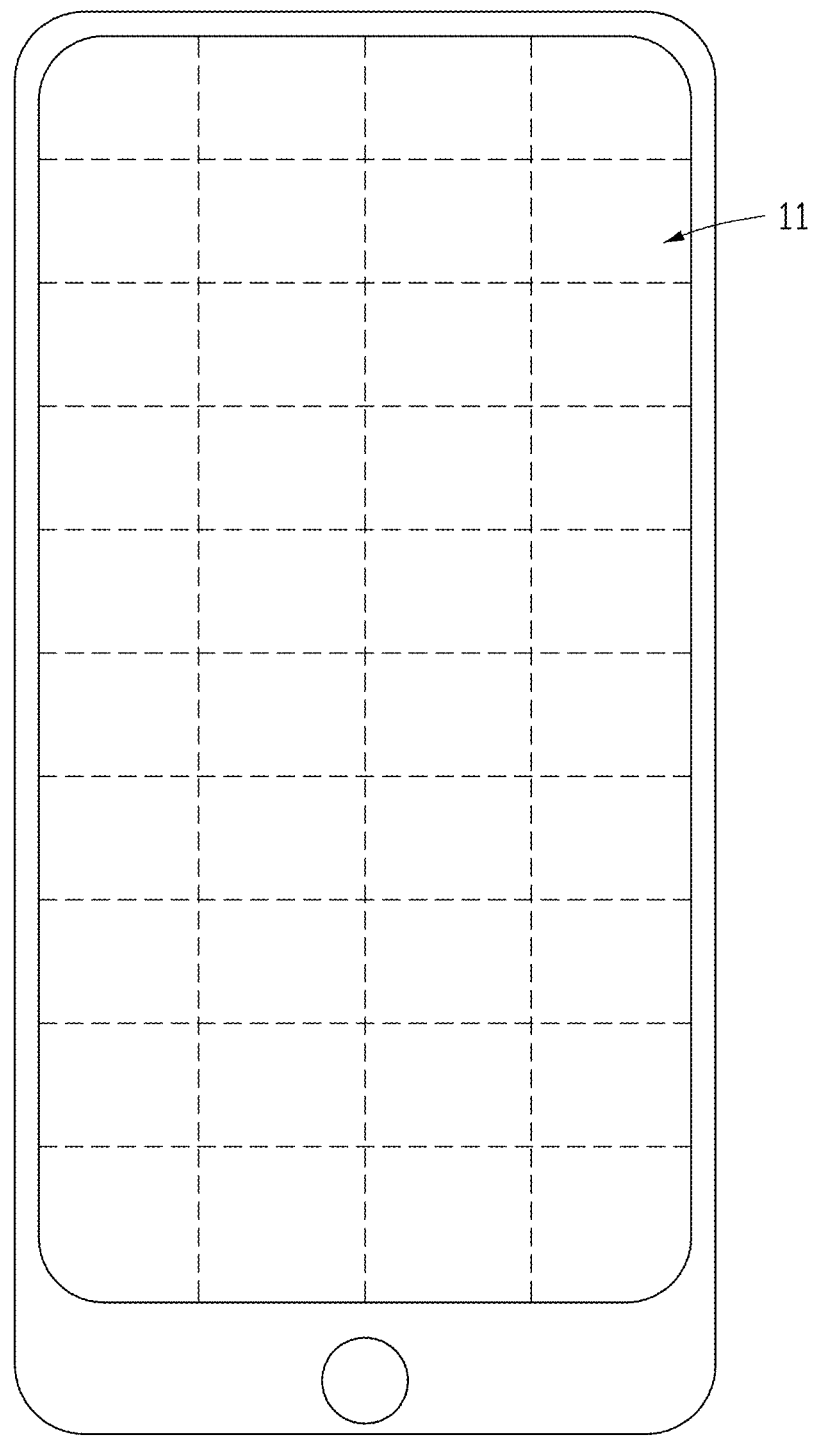
FIG. 1 is a planar view of a display device in an embodiment of the present disclosure.

It will be appreciated that for simplicity and clarity of illustration, where appropriate, reference numerals have been repeated among different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

As shown in FIG. 1, a display device 100 of the present embodiment is a self-illuminating display device, such as an organic light-emitting diode (OLED) display device, a micro light-emitting diode (micro-LED) display device, etc. The display device 100 may be any apparatus that can display images, such as a mobile phone, a computer, an outdoor display screen, etc.

The present embodiment takes the display device 100 as a micro-LED display as an example. The display device 100 defines a plurality of pixels 11 arranged in an array including a plurality of rows and a plurality of columns. Each pixel 11 emits image light independently, and the image light emitted by the pixels 11 is combined to display an image.

Figure 2:
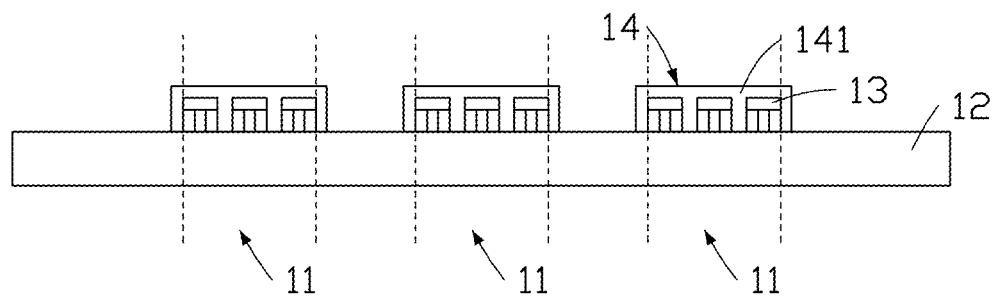
FIG. 2 shows the display device in a state of rest.

As shown in FIG. 2, in this embodiment, the display device 100 includes a substrate 12 and a plurality of light-emitting elements 13 on a surface of the substrate 12. In this embodiment, each light-emitting element 13 is a micro-LED. Each light-emitting element 13 is in one pixel 11, and three light-emitting elements 13 which each emit light of a different color comprise one pixel 11. In this embodiment, the light-emitting elements 13 in the same pixel 11 respectively emit red light, green light, and blue light. By adjusting luminous intensities of the three light-emitting elements 13 in the same pixel 11, a brightness and color of the image light emitted by the pixel 11 can be adjusted. In this embodiment, the display device 100 also includes a driving circuit (not shown in FIG. 2) on the surface of the substrate 12 provided with the light-emitting elements 13. The driving circuit is between the substrate 12 and the light-emitting elements 13 and is electrically connected to the light-emitting elements 13 to drive the light-emitting elements 13 to emit image light.

Figure 3:
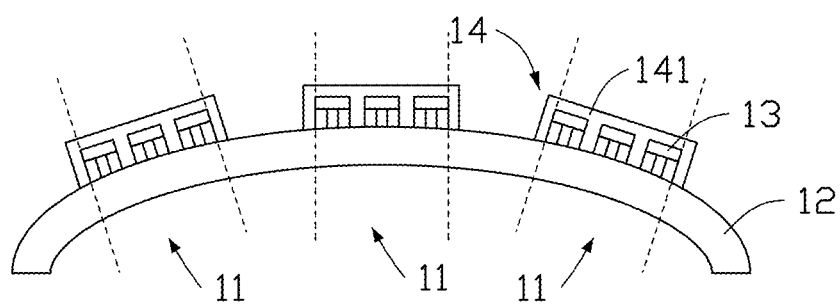
FIG. 3 shows the display device in a state of being pulled and deformed.

In this embodiment, the display device 100 includes a plurality of package units 14 spaced apart from each other. Each package unit 14 includes one or more pixels 11 (each package unit 14 is shown in FIG. 2, FIG. 3 includes only one pixel 11). Each package unit 14 includes a package layer 141 covering all the light-emitting elements 13 in one package unit 14. That is, the package layer 141 is enclosed with the substrate 12 to form a receiving space for accommodating conductive structures (such as the light-emitting elements 13) in the package units 14. That is, the package layer 141 fills gaps between conductive structures (such as the light-emitting elements 13) in the package unit 14. The package layer 141 is made of transparent and insulating material, such as acrylic, silica gel, epoxy, and other insulating materials. The package layer 141 transmits the image light emitted by the pixels 11 and protects the light-emitting elements 13 in the pixels 11. In this embodiment, each package unit 14 includes one pixel 11, and each package layer 141 covers three light-emitting elements 13 in one pixel 11.

In this embodiment, the display device 100 can be stretched. That is, in this embodiment, the display device 100 can maintain a resting state as shown in FIG. 2, and the display device 100 can be deformed and bent as shown in FIG. 3.

In this embodiment, the package unit 14 itself is not stretchable. The substrate 12 may be a stretchable plastic film that is made of polyimide (PI), colorless polyimide (CPI), polyethylene terephthalate (PET), polycarbonate (PC), acrylonitrile butadiene styrene plastic (ABS), polyethylene naphthalate (PEN), or propylene oxide (PO).

A part of the driving circuit is in the package units 14, and the other part of the driving circuit is between the package units 14. The other part of the driving circuit between the package units 14 is stretchable. That is, when the display device 100 is pulled, each package unit 14 hardly deforms, but the substrate 12 deforms, and the other part of the driving circuit between the package units 14 deforms, which makes the display device 100 readily deformable when pulled or bent.

By packaging the light-emitting elements 13 in the package units 14, the light-emitting elements 13 are protected by the package layers 141 from damage when the display device 100 is pulled. The other part of the driving circuit in the package units 14 is also protected from damage due to the package layers 141. Therefore, the display device 100 in this embodiment is stretchable, and works to reduce the effects of being pulled or bent on the conductive structures (such as the light-emitting elements 13) in the display device 100 by the package units 14 being in place, which also improves a structural stability of the display device 100.

Figure 4:
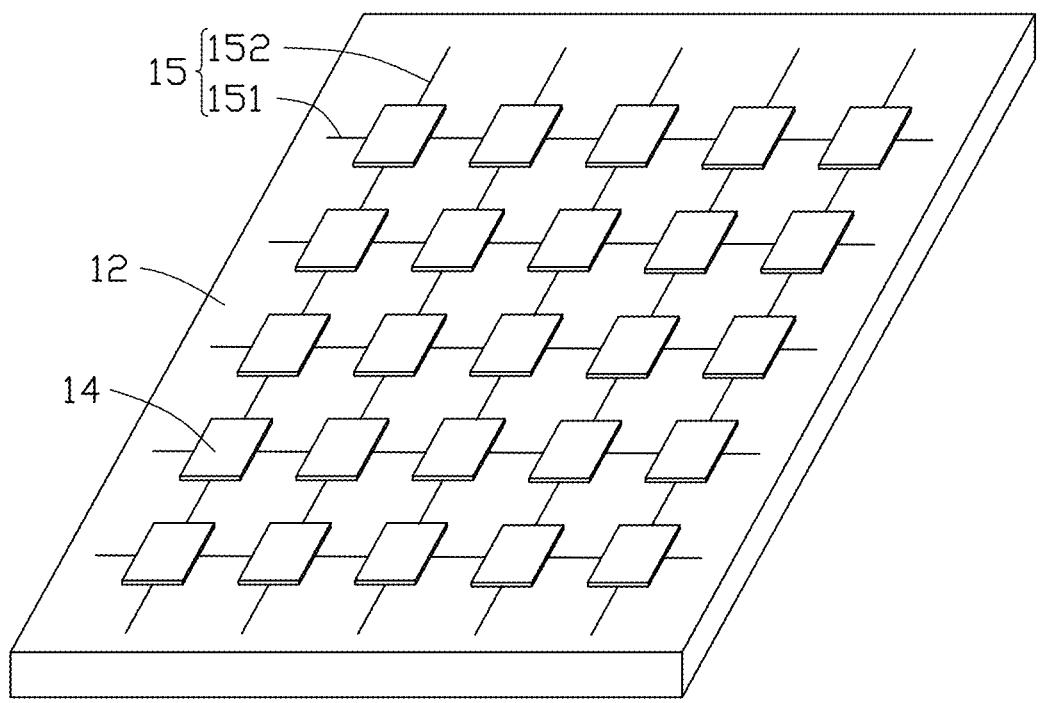
FIG. 4 is an isometric view of the display device.

As shown in FIG. 4, in this embodiment, the driving circuit 15 includes a plurality of gate lines 151 in parallel with each other and a plurality of data lines 152 in parallel with each other. The gate lines 151 and the data lines are crossed but insulated from each other. Each gate line 151 extends in a first direction, and each data line 152 extends in a second direction perpendicular to the first direction. In this embodiment, the first direction is a horizontal direction and the second direction is a vertical direction.

Each gate line 151 is electrically connected to all of the light-emitting elements 13 in the pixels 11 in one row for transmitting a gate driving signal to the light-emitting elements 13 in the same row of pixels 11. Each data line 152 is electrically connected to all of light-emitting elements 13 in the pixels 11 in a same column for transmitting a data signal to the light-emitting elements 13 in the same column of pixels 11.

Each light-emitting element 13 is electrically connected to one gate line 151 and one data line 152. Each light-emitting element 13 emits light according to a gate driving signal from one gate line 151 and a data signal from one data line 152.

In this embodiment, each gate line 151 is made of conductive material with ductility (i.e. not being totally rigid and brittle), such as copper (Cu), aluminum (Al), titanium (Ti), etc., which can slightly deform when the display device 100 is subjected to a tensile force. A part of each data line 152 is in the package units 14 and the other part of each data line 152 is between the package units 14.

Figure 5:
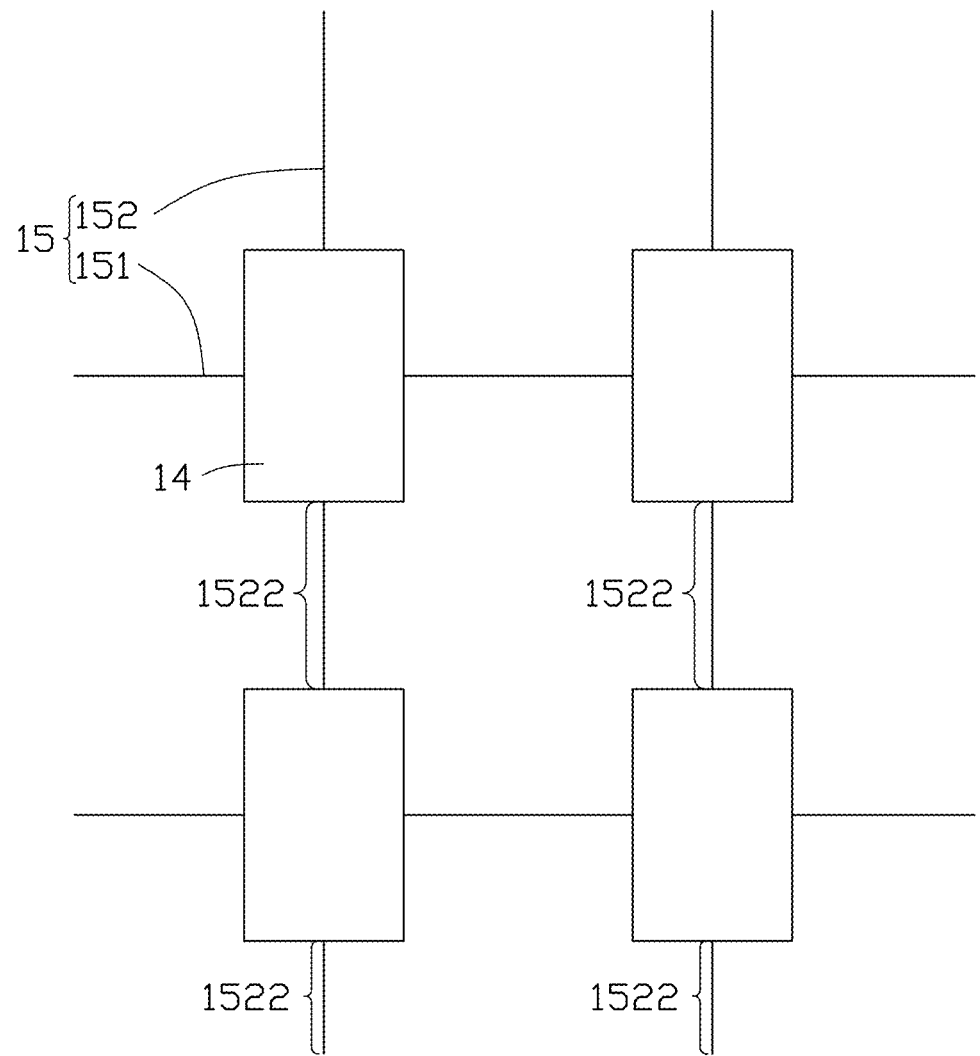
FIG. 5 is a partially enlarged view of the display device in FIG. 4.
Figure 6:
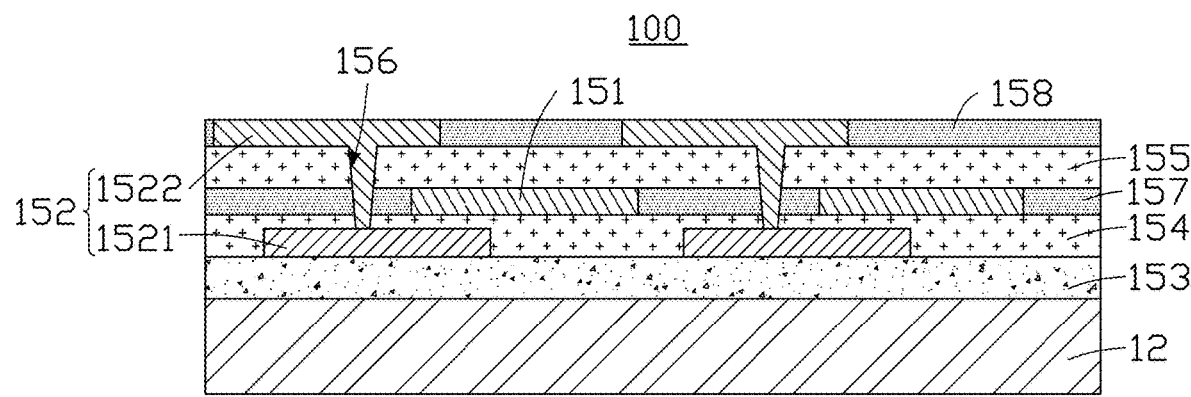
FIG. 6 is a cross sectional view of the display device.
Figure 7:
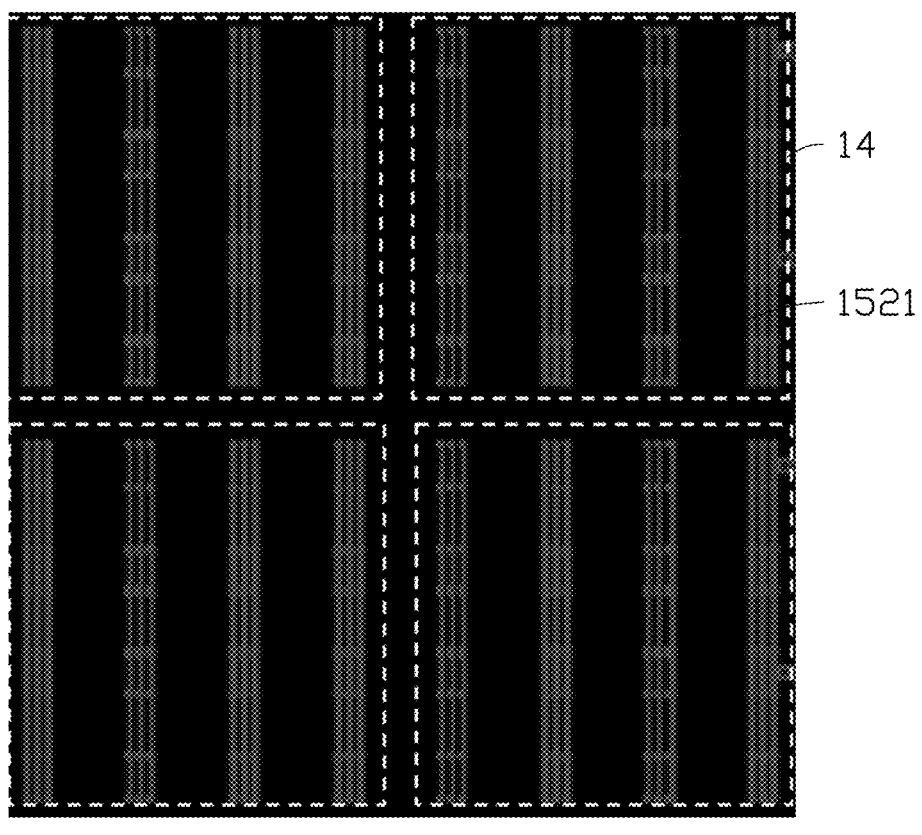
FIG. 7 is another planar view of the display device.
Figure 7:
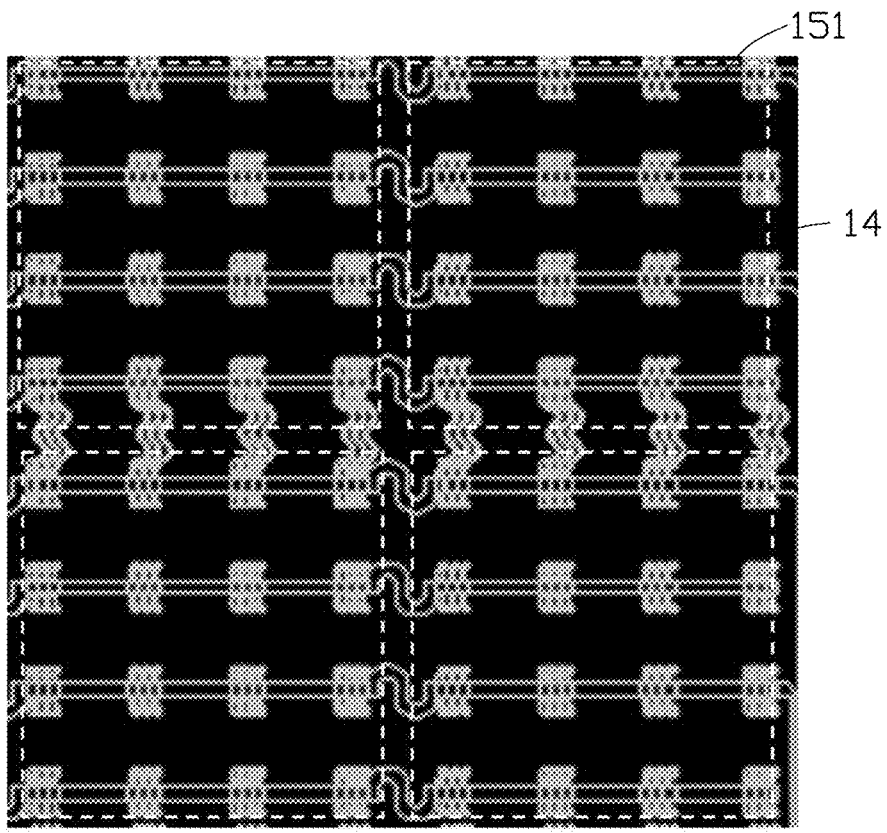

As shown in FIG. 5, FIG. 6, and FIG. 7, each data line 152 includes a first conductive portion 1521 and a second conductive portion 1522. The first conductive portion 1521 is the part of the data line 152 that is in the package units 14. The first conductive portion 1521 is made of brittle and rigid material, such as molybdenum (Mo) and polycrystalline silicon film (poly-Si). The second conductive portion 1522 is the part where the data line 152 is between the package units 14. The second conductive portion 1522 is made of material with ductility and can be deformed when the display device 100 is subjected to a tensile force.

As shown in FIG. 6, the driving circuit 15 also includes a buffer layer 153 on the surface of the substrate 12. The first conductive portion 1521 of each data line 152 is on a surface of the buffer layer 153 away from the substrate 12. The driving circuit 15 also includes a first insulating layer 154 covering the first conductive portion 1521. The gate lines 151 are on a surface of the first insulating layer 154 away from the first conductive portion 1521. The driving circuit 15 also includes a second insulating layer 155 covering the gate lines 151. The second conductive portion 1522 is on a surface of the second insulating layer 155 away from the first conductive portion 1521. The first insulating layer 154 and the second insulating layer 155 both have through holes 156. In each data line 152, the second conductive portion 1522 extends to the first conductive portion 1521 through at least one through hole 156 and is in electrical contact with the first conductive portion 1521. In the embodiment, the driving circuit 15 also includes a first protective layer 157 and a second protective layer 158. The first protective layer 157 is between the gate lines 151. That is, the first protective layer 157 is on a same layer as the gate lines 151 and fills spacing areas between the gate lines 151. The second protective layer 158 is between the second conductive portions 1522. That is, the second protective layer 158 is on a same layer as the second conductive portions 1522 and fills spacing areas between the second conductive portions 1522.

In other embodiments, an order of stacking the first conductive portion 1521, the second conductive portion 1522, and the gate lines 151 may be different.

In this disclosure, an impedance of each data line 152 is reduced by having a non-ductile first conductive portion 1521 (the impedance of brittle and rigid conductive material is small). The display device 100 can be stretched by having a ductile second conductive portion 1522. Therefore, by using such materials for each data line 152 including the first conductive portion 1521 and the second conductive portion 1522, a low impedance is achieved even though the device 100 can be stretched and bent.

In this embodiment, the second conductive portion 1522 in each data line 152 is a single-layer structure, that is, the second conductive portion 1522 includes a single material layer, which reduces the impedance of the data lines 152, simplifies a manufacture process of the data lines 152, and controls an overall thickness of the display device 100.

In other embodiments, the second conductive portion 1522 in each data line 152 may include a plurality of (two or more) sequentially stacked conductive layers.

Figure 8:
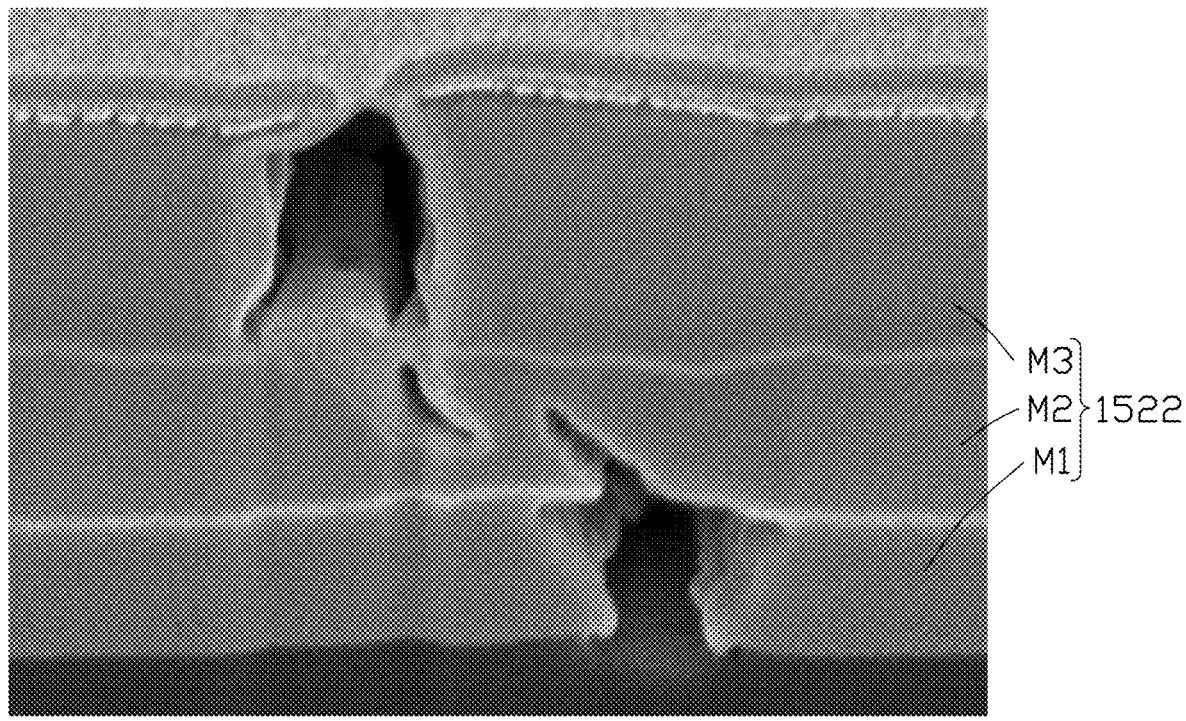
FIG. 8 shows a metallographic structure of a cross section view of a second conductive portion of the display device in another embodiment of the present disclosure.

As shown in FIG. 8, in another embodiment, the second conductive portion 1522 in each data line 152 includes three conductive layers, namely, a first conductive layer M1, a second conductive layer M2, and a third conductive layer M3, wherein the second conductive layer M2 is between the first conductive layer M1 and the third conductive layer M3. The first conductive layer M1 and the third conductive layer M3 are made of same material, and the second conductive layer M2 and the first conductive layer M1 are made of different materials. A Young's modulus of the second conductive layer M2 is lower than that of the first conductive layer M1 and the third conductive layer M3. In this embodiment, the first conductive layer M1 and the third conductive layer M3 are composed of molybdenum (Mo), and the second conductive layer M2 is composed of aluminum (Al). In other embodiments, the materials of the conductive layers can also be selected from gold (Au), silver (Ag) and copper (Cu), titanium (Ti), etc.

A tensile yield point can be measured by Young's modulus. The higher the Young's modulus, the lower the tensile yield point, while the lower the Young's modulus, the higher the tensile yield point. In the embodiment above, the Young's modulus of the second conductive layer M2 in the second conductive portion 1522 is the lowest, so the tensile yield point of the first conductive layer M1 and the third conductive layer M3 is lower than that of the second conductive layer M2. When the display device 100 is stretched, the first conductive layer M1, the second conductive layer M2, and the third conductive layer M3 are deformed, wherein the first conductive layer M1 and the third conductive layer M3 are more easily fractured than the second conductive layer M2, and the second conductive layer M2 can remain intact even when there is a large deformation. The existence of the second conductive layer M2 means that data signals can still pass in the second conductive layer M2 even if the first conductive layer M1 and the third conductive layer M3 are broken, so that the data line 152 can still transmit data signals, and the display device 100 will not fail.

Therefore, in the embodiment, the second conductive portion 1522 in each data line 152 includes three conductive layers, improving a structural stability and a functional stability of the display device 100.

Figure 9:
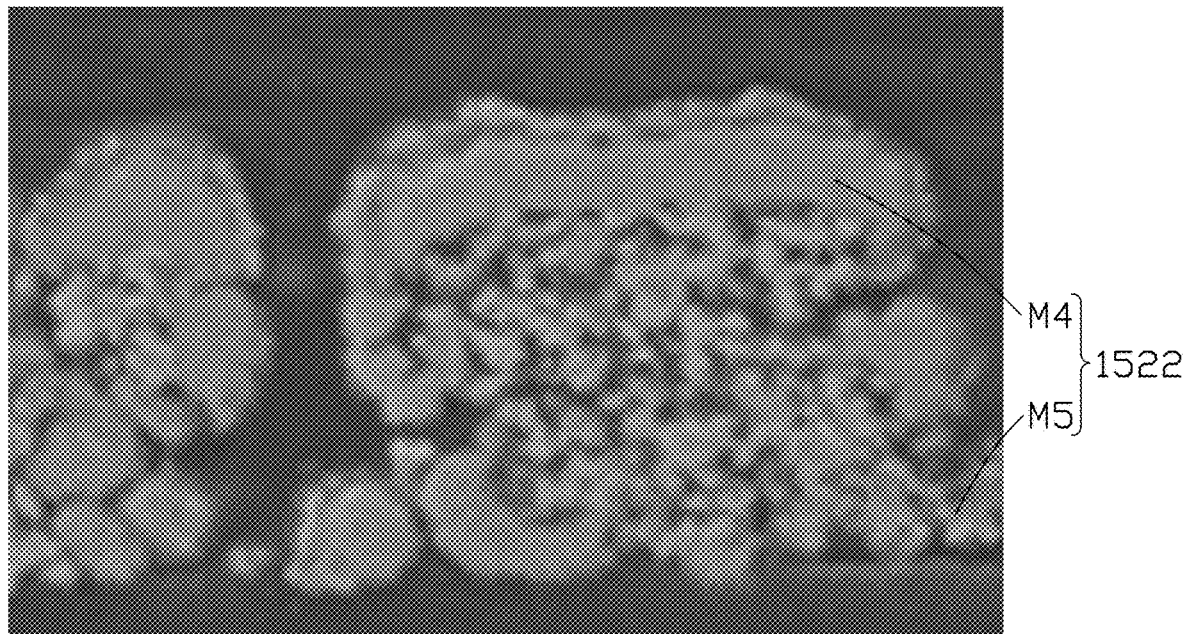
FIG. 9 shows a metallographic structure of a cross section view of a second conductive portion in another embodiment.

As shown in FIG. 9, in another embodiment, the second conductive portion 1522 in each data line 152 includes two conductive layers, namely, fourth conductive layer M4 and fifth conductive layer M5. The fourth conductive layer M4 is composed of metal with certain ductility, and the fifth conductive layer M5 is made of conductive adhesive. The conductive adhesive is ductile in the sense that it is less rigid than metal, and if the fourth conductive layer M4 is broken due to a tensile force, the fifth conductive layer M5 can remain conductive for signal transmissions.

Elasticity of the conductive layer composed of metal is limited. In this modified embodiment, the elasticity of the second conductive portion 1522 can reach 10% (greater than or equal to 10%). Therefore, the deformation or elastic capacity of the second conductive portion 1522 is enhanced by including the conductive adhesive.

In the display device 100 of the present embodiment, by packaging the light-emitting elements 13 in the package units 14, the light-emitting elements 13 are protected by the package layers 141 from being damaged when the display device 100 is subjected to a tensile force. The other part of the driving circuit in the package units 14 is also protected from being damaged by the tensile force due to the package layers 141. Therefore, the display device 100 in this embodiment is stretchable, and the influence of the tensile force on the conductive structures (such as the light-emitting elements 13) in the display device 100 formed in the package units 14 is reduced, and a structural stability of the display device 100 is improved.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A display device, comprising:
a substrate;
a plurality of light-emitting elements on a surface of the substrate;
a plurality of package units on the surface of the substrate, each of the plurality of package units defining at least one pixel, and at least one of the plurality of light-emitting elements being in each of the at least one pixel; and
a driving circuit on the surface of the substrate and being electrically connected to each of the plurality of light-emitting elements, the driving circuit being configured to transmit a plurality of gate driving signals and a plurality of data signals to drive the plurality of light-emitting elements to emit light to display images;
wherein the driving circuit is partially in the plurality of package units and is partially between the plurality of package units, both the substrate and a portion of the driving circuit between the plurality of package units are stretchable, and the plurality of package units are not stretchable;
the driving circuit comprises a plurality of gate lines and a plurality of data lines;
each of the plurality of gate lines electrically connects to at least one of the plurality of light-emitting elements and is configured to transmit one of the plurality of gate driving signals to the at least one of the plurality of light-emitting elements, and each of the plurality of gate lines is stretchable;
each of the plurality of data lines electrically connects to the at least one of the plurality of light-emitting elements and is configured to transmit one of the plurality of data signals to the at least one of the plurality of light-emitting elements;
each of the plurality of data lines comprises a first conductive portion and a second conductive portion electrically connected with each other, the first conductive portion is in the plurality of package units, and the second conductive portion is between adjacent package units, the first conductive portion is not stretchable, and the second conductive portion is stretchable;
the second conductive portion comprises a plurality of conductive layers stacked on each other;
the driving circuit further comprises a first insulating layer covering the first conductive portion, and the plurality of gate lines are on a surface of the first insulating layer away from the first conductive portion;
the driving circuit further comprises a second insulating layer covering the plurality of gate lines, and the second conductive portion is on a surface of the second insulating layer away from the first conductive portion; and
the first insulating layer and the second insulating layer are provided with a plurality of through holes, the second conductive portion extends to the first conductive portion through at least one of the plurality of through holes and is in electrical contact with the first conductive portion.

2. The display device of claim 1, wherein the driving circuit further comprises a buffer layer on the surface of the substrate, and the first conductive portion of each of the plurality of data lines is on a surface of the buffer layer away from the substrate.

3. The display device of claim 1, wherein the second conductive portion comprises a first conductive layer, a second conductive layer, and a third conductive layer; the second conductive layer is between the first conductive layer and the third conductive layer;
wherein both the first conductive layer and the third conductive layer are made of a same material, and the second conductive layer and the first conductive layer are made of different materials.

4. The display device of claim 3, wherein the first conductive layer, the second conductive layer, and the third conductive layer are made of metal.

5. The display device of claim 3, wherein a Young's modulus of the second conductive layer is less than that of the first conductive layer and the third conductive layer.

6. The display device of claim 5, wherein the first conductive layer, the second conductive layer, and the third conductive layer are made of metal.

7. The display device of claim 1, wherein each of the plurality of package units comprises a package layer covering the at least one of the plurality of light-emitting elements in a corresponding one package unit.

8. The display device of claim 1, wherein the second conductive portion comprises a fourth conductive layer and a fifth conductive layer, one of the fourth conductive layer and the fifth conductive layer is made of conductive adhesive and the other one of the fourth conductive layer and the fifth conductive layer is made of metal.

9. The display device of claim 8, wherein a tensile ratio of the second conductive portion is greater than or equal to 10%.

10. The display device of claim 1, wherein the driving circuit further comprises a first protective layer between the plurality of gate lines.

11. The display device of claim 1, wherein the driving circuit further comprises a second protective layer between the second conductive portions.

* * * * *

UNITED STATES PATENT AND TRADEMARK OFFICE
CERTIFICATE OF CORRECTION

| | | |
|---|---|---|
| PATENT NO. | : 11,715,423 B2 | Page 1 of 1 |
| APPLICATION NO. | : 17/547476 | |
| DATED | : August 1, 2023 | |
| INVENTOR(S) | : Ya-Chu Hsu et al. | |

It is certified that error appears in the above-identified patent and that said Letters Patent is hereby corrected as shown below:

On the Title Page

Please replace Item (73) with the following:
(73) Interface Technology (ChengDu) Co., Ltd., ChengDu (CN);
INTERFACE OPTOELECTRONICS (SHENZHEN) CO., LTD., Shenzhen (CN);
INTERFACE OPTOELECTRONICS (WUXI) CO., LTD., Wuxi (CN);
GENERAL INTERFACE SOLUTION LIMITED, Zhunan (TW)

Signed and Sealed this
Twenty-first Day of May, 2024

Katherine Kelly Vidal
*Director of the United States Patent and Trademark Office*